(12) United States Patent
Nakanishi et al.

(10) Patent No.: US 10,600,803 B2
(45) Date of Patent: Mar. 24, 2020

(54) SEMICONDUCTOR MEMORY DEVICE

(71) Applicant: TOSHIBA MEMORY CORPORATION, Tokyo (JP)

(72) Inventors: Yusuke Nakanishi, Yokkaichi Mie (JP); Takaya Yamanaka, Yokkaichi Mie (JP); Akira Matsumura, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/120,412

(22) Filed: Sep. 3, 2018

(65) Prior Publication Data

US 2019/0198523 A1    Jun. 27, 2019

(30) Foreign Application Priority Data

Dec. 27, 2017 (JP) ................. 2017-252120

(51) Int. Cl.
| | | |
|---|---|---|
| H01L 27/11582 | (2017.01) | |
| H01L 27/11565 | (2017.01) | |
| H01L 27/1157 | (2017.01) | |
| H01L 27/11575 | (2017.01) | |
| H01L 27/11519 | (2017.01) | |
| H01L 23/532 | (2006.01) | |
| G11C 16/26 | (2006.01) | |

(Continued)

(52) U.S. Cl.
CPC .... *H01L 27/11582* (2013.01); *H01L 27/1157* (2013.01); *H01L 27/11519* (2013.01); *H01L 27/11565* (2013.01); *H01L 27/11575* (2013.01); *G11C 16/0483* (2013.01); *G11C 16/08* (2013.01); *G11C 16/26* (2013.01); *H01L 23/53295* (2013.01)

(58) Field of Classification Search
None
See application file for complete search history.

(56) References Cited

U.S. PATENT DOCUMENTS

| | | | |
|---|---|---|---|
| 8,405,142 B2 | 3/2013 | Katsumata et al. | |
| 2016/0049423 A1* | 2/2016 | Yoo | H01L 27/11582 257/324 |
| 2016/0284727 A1* | 9/2016 | Sonehara | H01L 27/11582 |

(Continued)

FOREIGN PATENT DOCUMENTS

JP    2012069710 A    4/2012

*Primary Examiner* — Grant S Withers
(74) *Attorney, Agent, or Firm* — Kim & Stewart LLP

(57) ABSTRACT

A semiconductor memory device includes first and second wiring layers above a semiconductor substrate, a memory pillar extending through the first and second wiring layers, a first plug contacting the first wiring layer, a second plug contacting the second wiring layer, a first pillar adjacent to the first plug and extending through the first wiring layer, and a second pillar adjacent to the second plug and extending through the first and second wiring layers. The memory pillar includes a first semiconductor layer, a second semiconductor layer over the first semiconductor layer, and a third insulating layer, a charge storage layer, and a fourth insulating layer on a side surface of the second semiconductor layer. The distance between the center of the first plug and the center of the first pillar is greater than the distance between the center of the second plug and the center of the second pillar.

20 Claims, 12 Drawing Sheets

(51) Int. Cl.
*G11C 16/04* (2006.01)
*G11C 16/08* (2006.01)

(56) References Cited

U.S. PATENT DOCUMENTS

| | | | |
|---|---|---|---|
| 2017/0040337 A1* | 2/2017 | Kim | H01L 27/11582 |
| 2017/0077133 A1 | 3/2017 | Sonehara et al. | |
| 2017/0200731 A1 | 7/2017 | Yoshimoto et al. | |
| 2017/0213845 A1* | 7/2017 | Baba | H01L 27/11582 |
| 2017/0236834 A1 | 8/2017 | Fukumura | |
| 2019/0088672 A1* | 3/2019 | Tomimatsu | H01L 27/11582 |

* cited by examiner

SEMICONDUCTOR MEMORY DEVICE

CROSS-REFERENCE TO RELATED APPLICATION

This application is based upon and claims the benefit of priority from Japanese Patent Application No. 2017-252120, filed Dec. 27, 2017, the entire contents of which are incorporated herein by reference.

FIELD

Embodiments described herein relate generally to a semiconductor memory device.

BACKGROUND

As a semiconductor memory device, a NAND flash memory is known.

DETAILED DESCRIPTION

Figure 1:
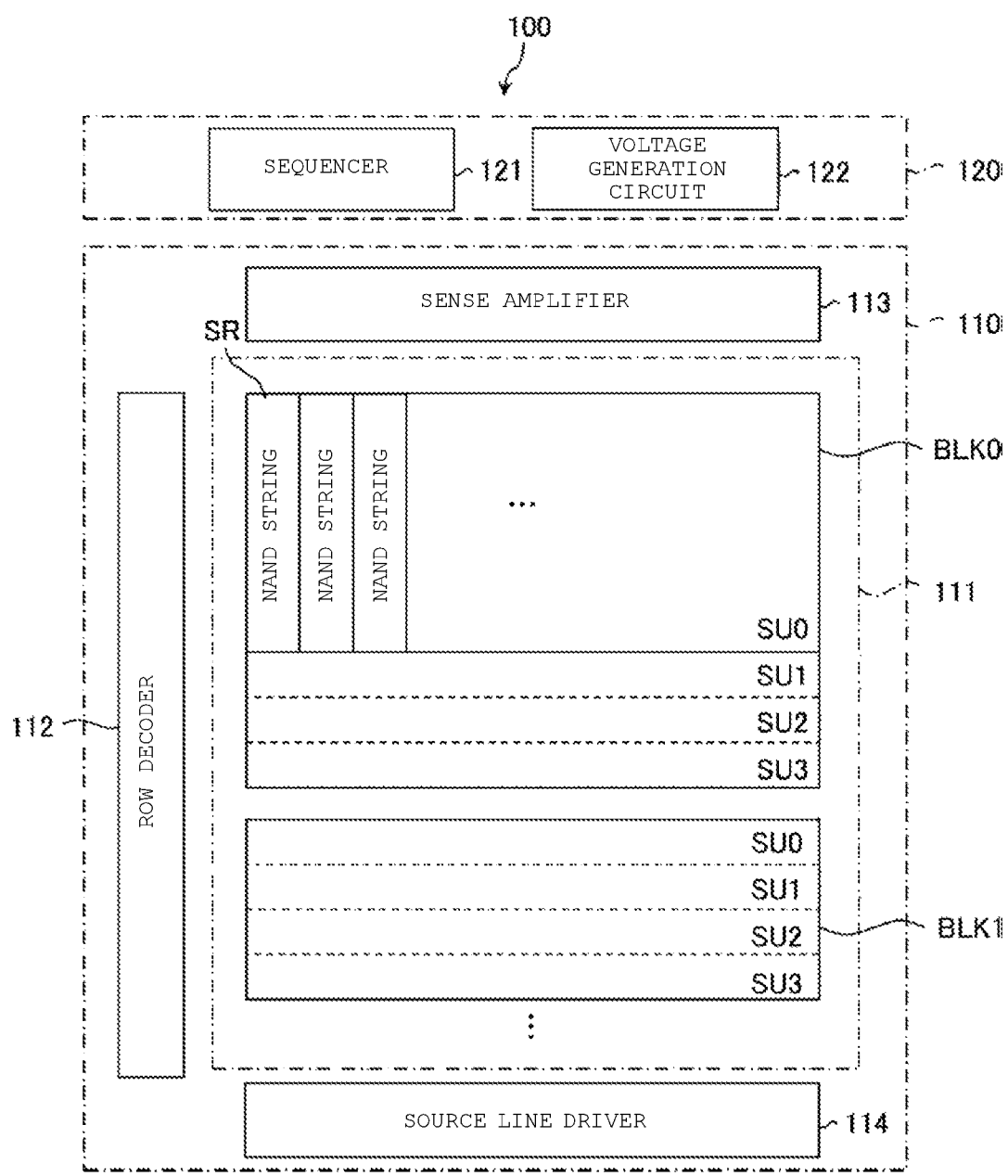
FIG. 1 is a block diagram of a semiconductor memory device according to a first embodiment.

Embodiments provide a semiconductor memory device capable of improving reliability.

In general, according to one embodiment, a semiconductor memory device includes a first wiring layer above a semiconductor substrate and a first insulating layer therebetween, a second wiring layer above the first wiring layer and a second insulating layer therebetween, a memory pillar extending in a first direction intersecting the semiconductor substrate and through the first and second wiring layers, a first plug contacting and electrically connected to the first wiring layer, a second plug contacting and electrically connected to the second wiring layer, a first pillar located adjacent to the first plug and extending through the first wiring layer, and a second pillar located adjacent to the second plug and extending through the first and second wiring layers. The memory pillar includes a first semiconductor layer, a second semiconductor layer located over the first semiconductor layer, and a third insulating layer, a charge storage layer, and a fourth insulating layer located on a side surface of the second semiconductor layer. The first wiring layer is a lowermost wiring layer above the semiconductor substrate. The distance between the center of the first plug and the center of the first pillar is greater than the distance between the center of the second plug and the center of the second pillar.

Hereinafter, embodiments will be described with reference to the drawings. In the description, common portions are denoted by the same reference numerals in the drawings.

1. First Embodiment

A semiconductor memory device according to a first embodiment will be described. In the following description, as an example of a semiconductor memory device, a three-dimensionally-stacked NAND flash memory in which memory cell transistors are stacked one above the other over a semiconductor substrate will be described.

1.1 Configuration

1.1.1 Overall Configuration of Semiconductor Memory Device

First, an overall configuration of a semiconductor memory device will be described with reference to FIG. 1. FIG. 1 is a block diagram illustrating an overall configuration of a NAND flash memory 100.

As illustrated in FIG. 1, a NAND flash memory 100 includes a memory core unit 110 and a peripheral circuit 120.

The memory core unit 110 includes a memory cell array 111, a row decoder 112, a sense amplifier 113, and a source line driver 114.

The memory cell array 111 includes a plurality of blocks BLK (BLK0, BLK1, . . . ) which are sets of a plurality of nonvolatile memory cell transistors. Data in the same block BLK is erased, for example, at once.

Each of the blocks BLK includes a plurality of string units SU (for example, SU0, SU1, SU2, and SU3). Each string unit SU includes a plurality of NAND strings SR. In the NAND string SR, a plurality of memory cell transistors are connected in series. In the memory cell array 111, the number of the blocks BLK, the number of the string units SU, and the number of the NAND strings SR are randomly set.

In a write operation, a read operation, and an erasing operation, the row decoder 112 decodes addresses of the blocks BLK and addresses of the string units SU, and selects a target word line.

In a read operation, the sense amplifier 113 senses data which is read from the memory cell transistor to a bit line. In a write operation, write data is transmitted to the memory cell transistor.

The source line driver 114 applies a required voltage to a source line during a write operation, a read operation, and an erasing operation.

The peripheral circuit 120 includes a sequencer 121 and a voltage generation circuit 122.

The sequencer 121 controls operations of the entire NAND flash memory 100.

The voltage generation circuit 122 generates a voltage required for a write operation, a read operation, and an erasing operation, and supplies the voltage to the row decoder 112, the sense amplifier 113, the source line driver 114, and the like.

1.1.2 Configuration of Memory Cell Array

Next, a configuration of the memory cell array 111 will be described with reference to FIG. 2. In an example of FIG. 2, a circuit diagram of the block BLK0 is illustrated. Other blocks BLK have the same configuration.

Figure 2:
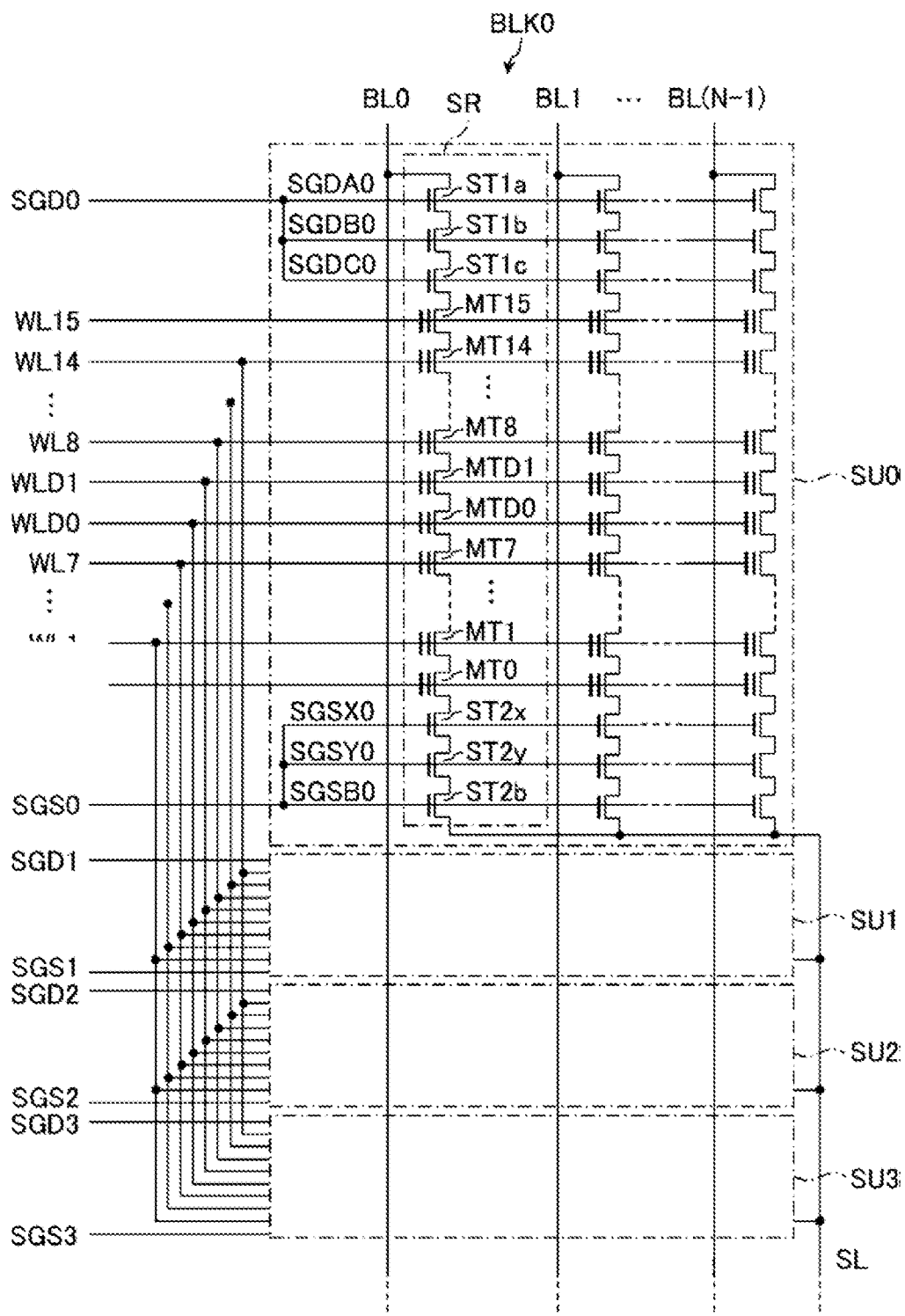
FIG. 2 is a circuit diagram of the semiconductor memory device according to the first embodiment.

As illustrated in FIG. 2, each of the NAND strings SR includes, for example, 16 memory cell transistors MT (MT0 to MT15), two dummy memory cell transistors MTD (MTD0 and MTD1), three select transistors ST1 (ST1a, ST1b, and ST1c), and three select transistors ST2 (ST2x, ST2y, and ST2b). Each of the memory cell transistors MT include a stacked gate including a control gate and a charge storage layer, and holds data in a nonvolatile manner.

The memory cell transistor MT may be a MONOS type memory cell transistor using an insulating film as a charge storage layer, or an FG type memory cell transistor using a conductive film as a charge storage layer. Hereinafter, in the present embodiment, an example in which the memory cell transistor MT is a MONOS type memory cell transistor will be described. In addition, the number of the memory cell transistors MT is not limited to 16, and may be randomly set to 8, 32, 64, 96, or the like. The number and arrangement of the dummy memory cell transistors MTD are randomly set. For example, the number of the dummy memory cell transistors MTD may be zero. Further, for example, the dummy memory cell transistor MTD may be provided between a select gate line SGD or SGS and a word line WL. In the example of FIG. 2, a case where the number of the select transistors ST1 is three and the number of the select transistors ST2 is three is illustrated. On the other hand, the number of the select transistors ST1 may be one or more, and the number of the select transistors ST2 may be one or more.

Current paths of the memory cell transistors MT0 to MT7, the dummy memory cell transistors MTD0 and MTD1, and the memory cell transistors MT8 to MT15 are connected in series. A drain of the memory cell transistor MT15 is connected to a source of the select transistor ST1 (ST1c), and a source of the memory cell transistor MT0 is connected to a drain of the select transistor ST2 (ST2x).

Current paths of the select transistors ST1a, ST1b, and ST1c are connected in series. A drain of the select transistor ST1a is connected to the corresponding bit line BL. Gates of the select transistors ST1a, ST1b, and ST1c are commonly connected to one select gate line SGD0 via each of select gate lines SGDA0, SGDB0, and SGDC0. Therefore, the three select transistors ST1a, ST1b, and ST1c function as one select transistor ST1. Hereinafter, the select gate lines SGDA0, SGDB0, and SGDC0 are simply referred to as select gate lines SGD or select gate lines SGDA, SGDB, and SGDC in a case where the select gate lines are not specified in the string unit SU.

Similarly, current paths of the select transistors ST2x, ST2y, and ST2b are connected in series. A source of the select transistor ST2b is connected to a source line SL. Gates of the select transistors ST2x, ST2y, and ST2b are commonly connected to one select gate line SGS0 via each of select gate lines SGSX0, SGSY0, and SGSB0. Therefore, the three select transistors ST2x, ST2y, and ST2b function as one select transistor ST2. Hereinafter, the select gate lines SGSX0, SGSY0, and SGSB0 are simply referred to as select gate lines SGS or select gate lines SGSX, SGSY, and SGSB in a case where the select gate lines are not specified in the string unit SU. Each string unit SU in the block BLK may be commonly connected to one select gate line SGS.

The gates of the select transistors ST1 (ST1a, ST1b, and ST1c) of each NAND string SR in the same string unit SU are commonly connected to the same select gate line SGD. In the example of FIG. 2, the gates of the select transistors ST1 in the string unit SU0 of the block BLK0 are commonly connected to the select gate line SGD0, and the gates of the select transistors ST1 (not illustrated) in the string unit SU1 are commonly connected to the select gate line SGD1. Similarly, the gates of the select transistors ST1 (not illustrated) in the string unit SU2 are commonly connected to the select gate line SGD2, and the gates of the select transistors ST1 (not illustrated) in the string unit SU3 are commonly connected to the select gate line SGD3.

The gates of the select transistors ST2 (ST2x, ST2y, and ST2b) of each NAND string SR in the same block BLK are commonly connected to the same select gate line SGS. In the example of FIG. 2, the gates of the select transistors ST2 in the string unit SU0 of the block BLK0 are commonly connected to the select gate line SGS0. The same is true in the string units SU1 to SU3.

The control gates of the memory cell transistors MT0 to MT15 of each NAND string SR in the same block BLK are commonly connected to word lines WL0 to WL15 different from each other. Similarly, the control gates of the dummy memory cell transistors MTD0 and MTD1 are commonly connected to dummy word lines WLD0 and WLD1 different from each other.

In the NAND strings SR arranged in a matrix configuration in the memory cell array 111, the drains of the select transistors ST1 (ST1a) of the NAND strings SR in the same row are connected to bit lines BL (BL0 to BL(N−1), (N−1) is an integer equal to or larger than one) different from each other, and the drains of the select transistors ST1 (ST1a) of the NAND strings SR in the same column are commonly connected to the bit lines BL0 to BL(N−1). That is, the bit lines BL are commonly connected to the NAND strings SR in the plurality of blocks BLK. In addition, the sources of the select transistors ST2 (ST2b) in each block BLK are commonly connected to the source line SL. That is, the source line SL is commonly connected to the NAND strings SR in the plurality of blocks BLK.

That is, the string unit SU is an assembly of the NAND strings SR that are connected to the bit lines BL different from each other and are connected to the same select gate line SGD. In addition, the block BLK is an assembly of the plurality of string units SU that are connected to the common word lines WL. The memory cell array 111 is an assembly of the plurality of blocks BLK that are connected to the common bit lines BL.

A data write operation and a data read operation are collectively performed for the memory cell transistors MT that are connected to any one of the word lines WL in any one of the string units SU.

A data erasing operation can be performed in units of the block BLK or in units smaller than the block BLK.

The memory cell array 111 may have another configuration. That is, a configuration of the memory cell array 111 is described in, for example, U.S. patent application Ser. No. 12/407,403 (THREE DIMENSIONAL STACKED NONVOLATILE SEMICONDUCTOR MEMORY) filed on Mar. 19, 2009. In addition, a configuration of the memory cell array 111 is described in, U.S. patent application Ser. No.

12/406,524 (THREE DIMENSIONAL STACKED NON-VOLATILE SEMICONDUCTOR MEMORY) filed on Mar. 18, 2009, U.S. patent application Ser. No. 12/679,991 (NON-VOLATILE SEMICONDUCTOR STORAGE DEVICE AND METHOD OF MANUFACTURING THE SAME) filed on Mar. 25, 2010, and U.S. patent application Ser. No. 12/532,030 (SEMICONDUCTOR MEMORY AND METHOD FOR MANUFACTURING SAME) filed on Mar. 23, 2009. The entire contents of these patent applications are incorporated herein by reference.

Figure 3:
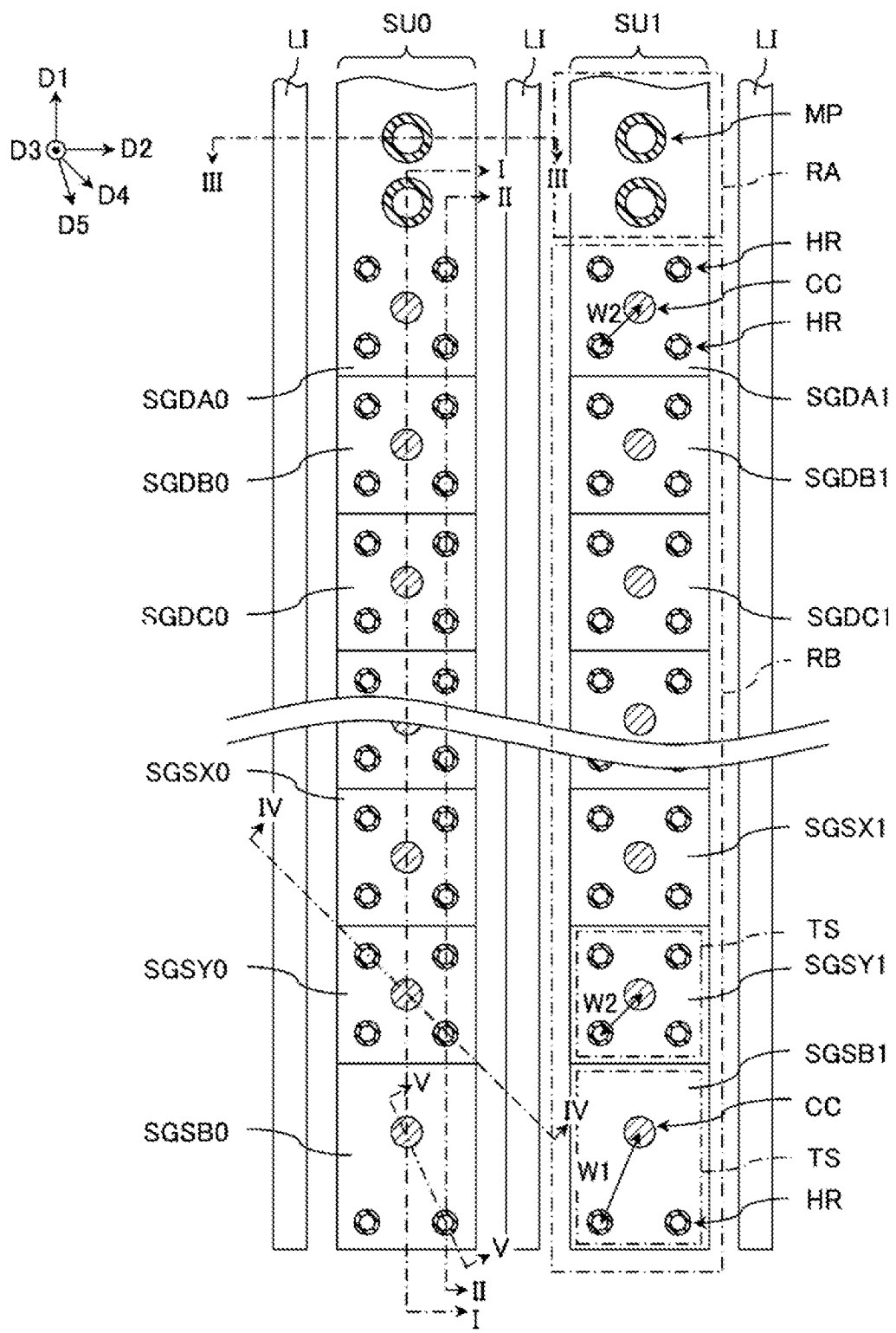
FIG. 3 is a plan view of a memory cell array in the semiconductor memory device according to the first embodiment.
Figure 4:
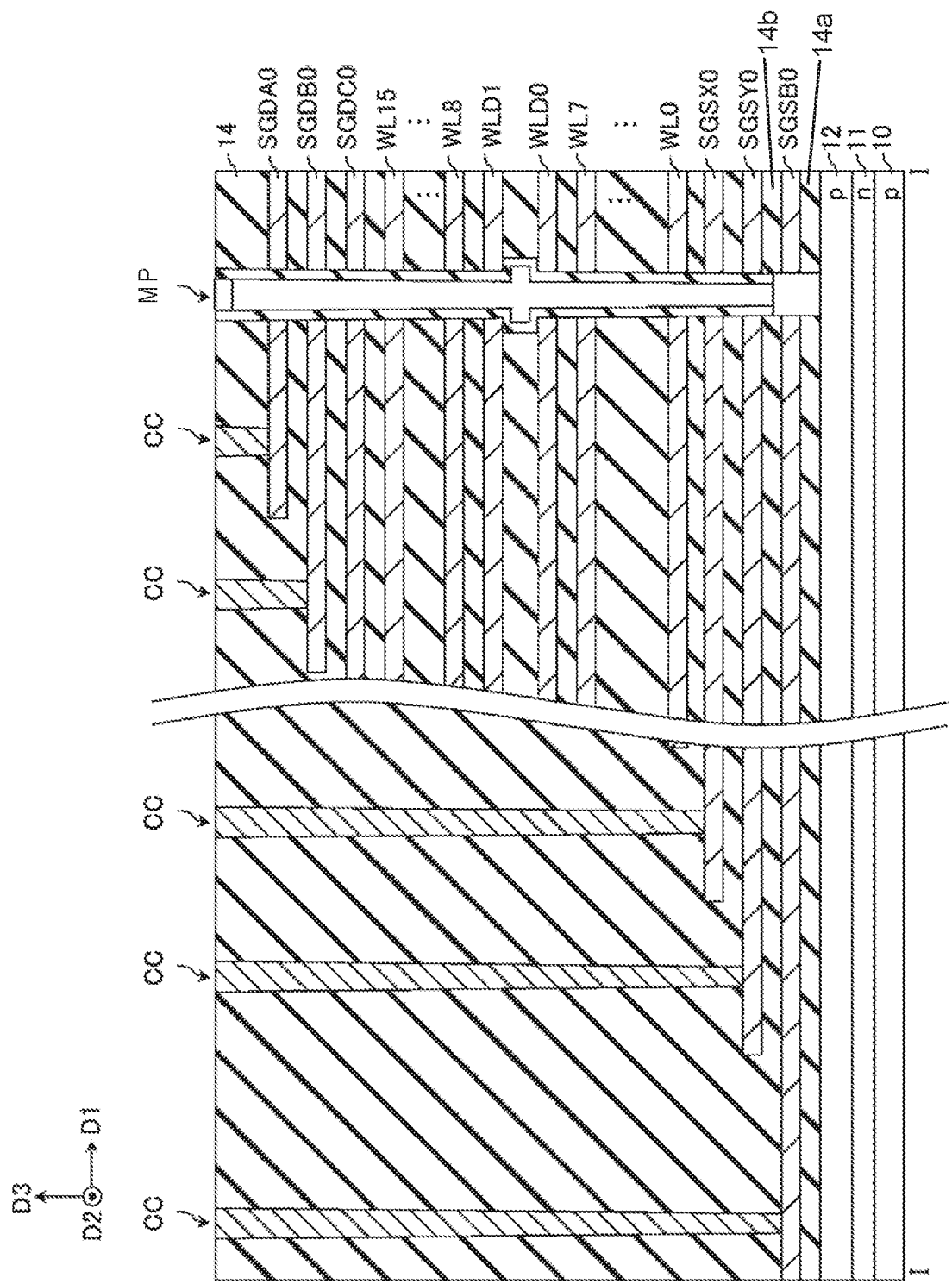
FIG. 4 is a sectional view of the memory cell array taken along a line I-I of FIG. 3.
Figure 5:
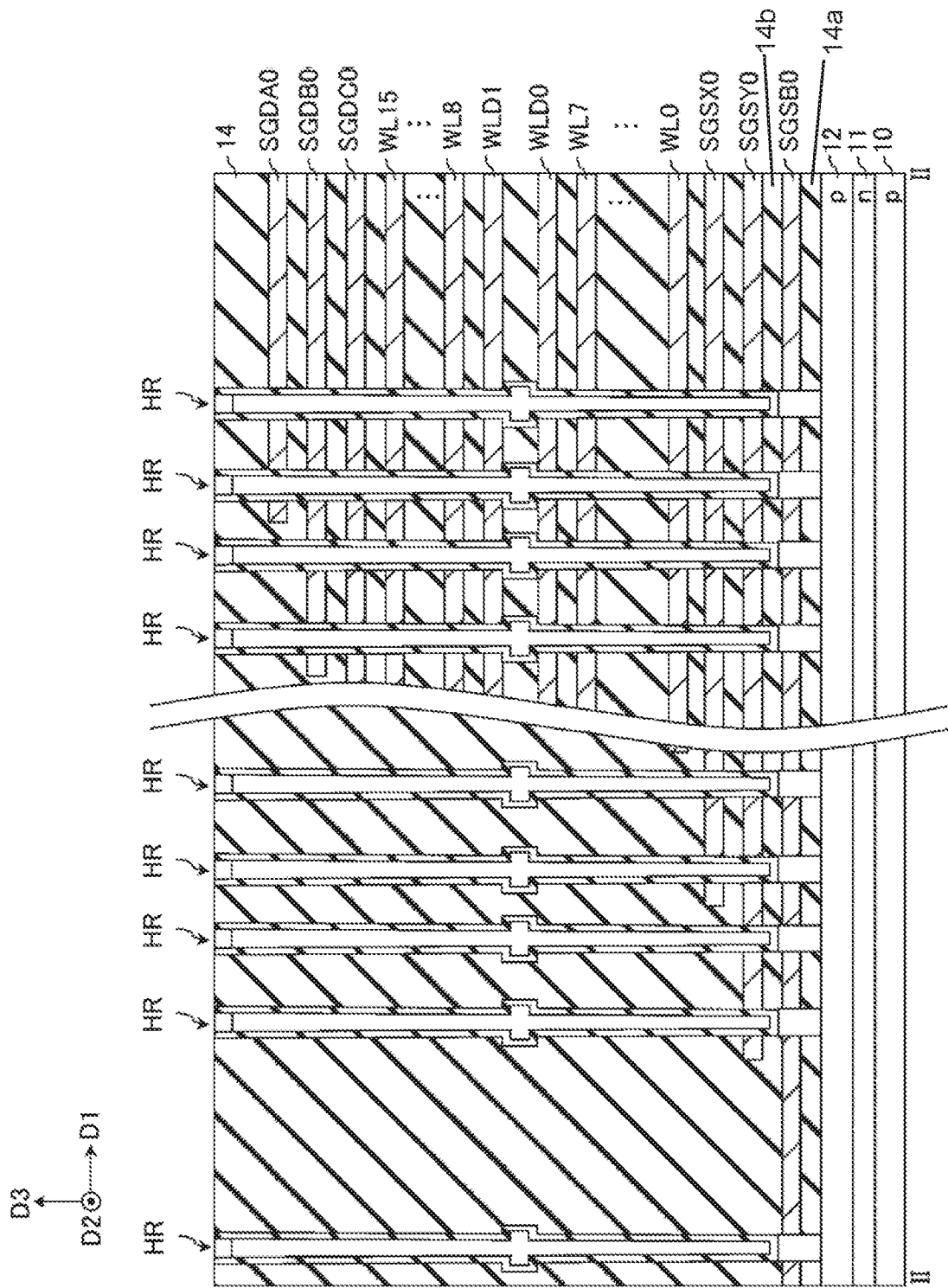
FIG. 5 is a sectional view of the memory cell array taken along a line II-II of FIG. 3.
Figure 6:
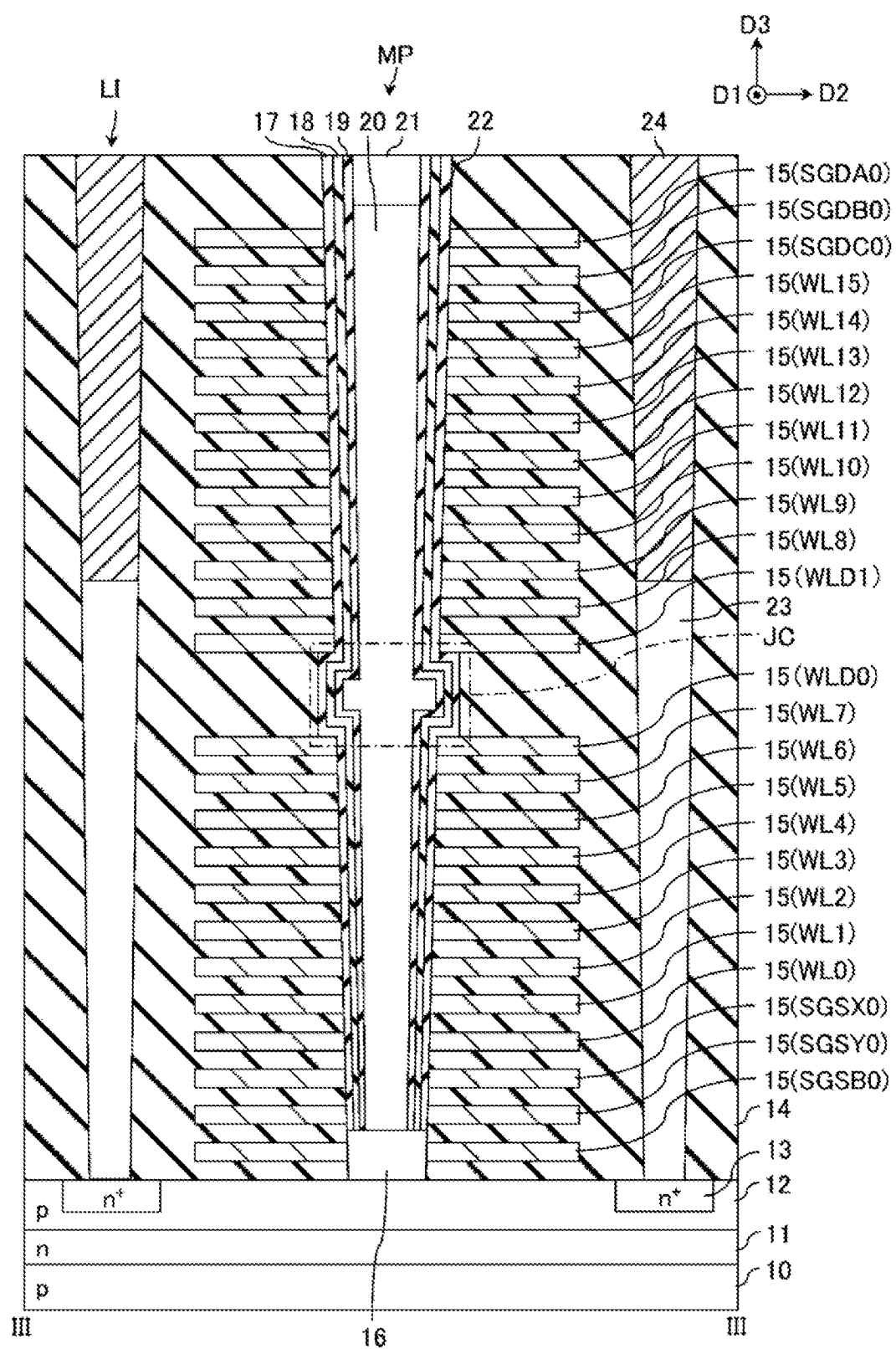
FIG. 6 is a sectional view of the memory cell array taken along a line III-III of FIG. 3.
Figure 7:
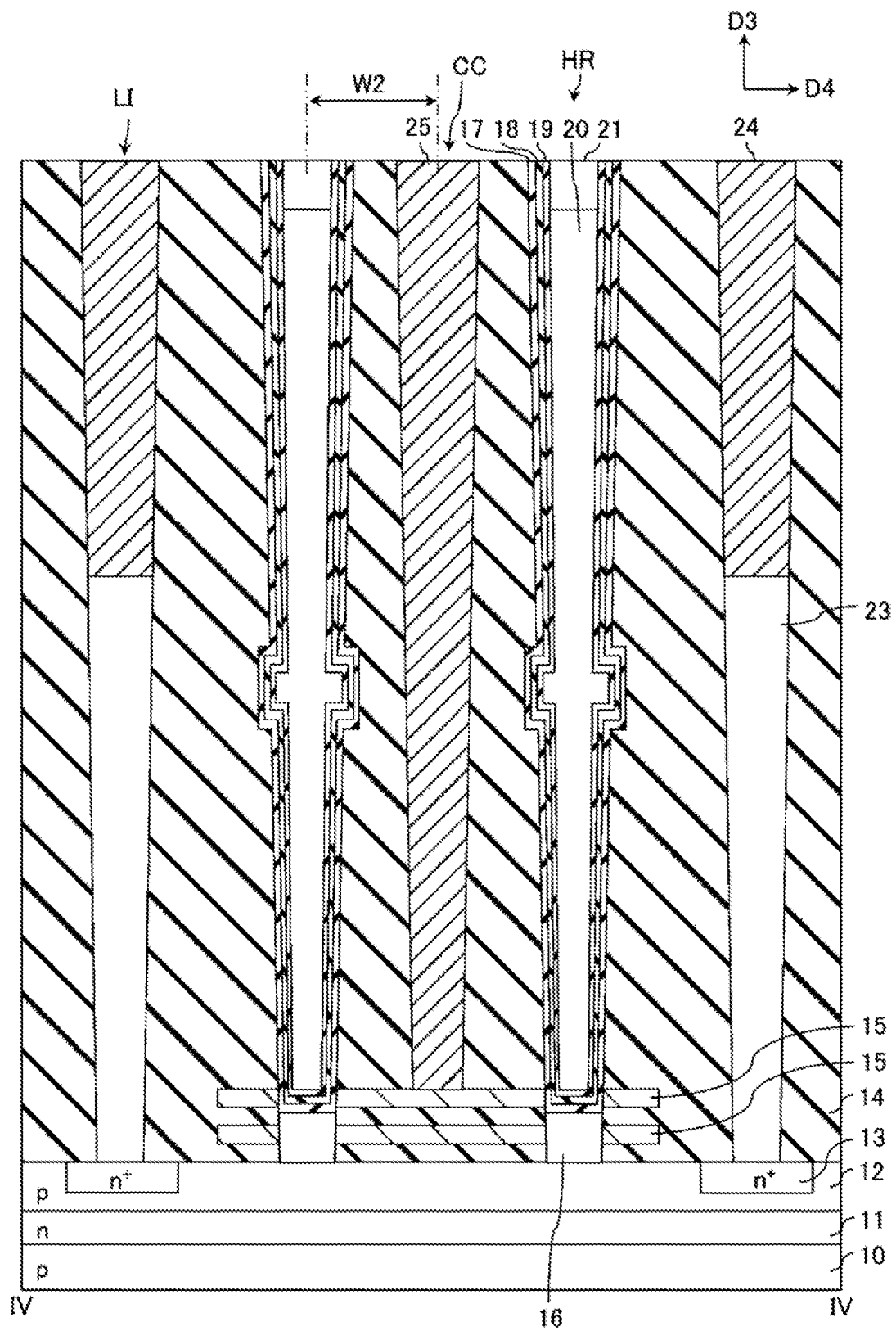
FIG. 7 is a sectional view of the memory cell array taken along a line IV-IV of FIG. 3.
Figure 8:
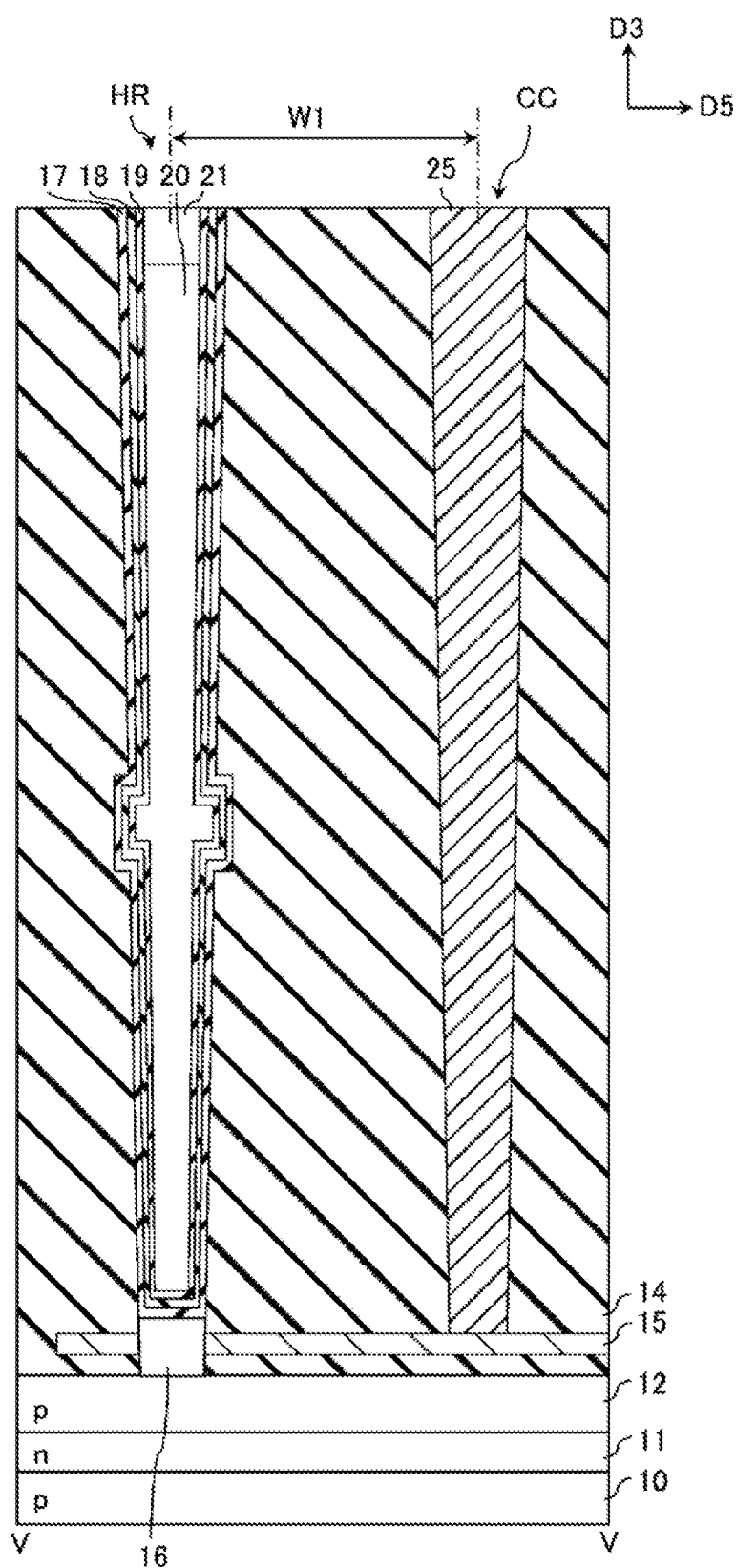
FIG. 8 is a sectional view of the memory cell array taken along a line V-V of FIG. 3.

Next, a structure of the memory cell array 111 will be described in detail with reference to FIG. 3 to FIG. 8. FIG. 3 is a plan view of the string units SU0 and SU1. FIG. 4 is a sectional view of memory pillars MP and contact plugs CC taken along a line I-I illustrated in FIG. 3. FIG. 5 is a sectional view of dummy pillars HR taken along a line II-II illustrated in FIG. 3. FIG. 6 is a sectional view of the memory pillars MP taken along a line III-III illustrated in FIG. 3. FIG. 7 is a sectional view of the dummy pillars HR and the contact plugs CC taken along a line IV-IV illustrated in FIG. 3. FIG. 8 is a sectional view of the dummy pillars HR and the contact plugs CC taken along a line V-V illustrated in FIG. 3. In order to simplify an explanation, in FIG. 3, interlayer insulating films are omitted. In FIG. 4 and FIG. 5, a part of wiring layers corresponding to the word lines WL is omitted. In addition, in examples of FIG. 4 to FIG. 6, although the memory cell array 111 is provided on the semiconductor substrate via interlayer insulating films, a circuit (sense amplifier 113 or the like) may be provided between the semiconductor substrate and the memory cell array 111. More specifically, for example, a transistor or a wiring used for the sense amplifier 113 or the like may be disposed between the semiconductor substrate and the select gate line SGSB.

As illustrated in FIG. 3, the memory cell array 111 includes string units SU and source line contacts LI.

The source line contact LI is a line-shaped contact extending along a first direction D1 parallel to the semiconductor substrate, and is periodically disposed along a second direction D2 perpendicular to the first direction D1 and parallel to the semiconductor substrate. A bottom surface of the source line contact LI is in contact with the semiconductor substrate. One string unit SU extending in the first direction D1 is disposed between the two adjacent source line contacts LI in the second direction D2.

The string unit SU includes a region RA in which the memory cell transistors MT are provided, and a region RB from which end portions of the word lines WL, the dummy word lines WLD, and the select gate lines SGD and SGS are drawn in a stepped shape.

In the region RA, a memory pillar MP functioning as a NAND string SR is provided. In the example of FIG. 3, in order to simplify the explanation, a case where the memory pillars MP are arranged in a line along the first direction D1 is illustrated. On the other hand, disposition of the memory pillars MP may be randomly set. For example, the memory pillars MP may be arranged in two rows or four rows in parallel along the first direction D1, or may be arranged in a staggered arrangement of four rows.

In the region RB, the word lines WL, the dummy word lines WLD, and the select gate lines SGD and SGS of each string unit SU extend in the first direction D1, and the ends thereof are provided in a staircase shape and spaced from one another in the first direction D1 and the third direction D3 perpendicular to the first and second directions D1 and D2 as shown in FIG. 4. Hereinafter, each step portion of the staircase, i.e., the end portion of a line which does not have word or select gate lines directly thereover is referred to as a "terrace TS". Adjacent terraces TS are spaced from one another in the third direction D3 and in the first direction D1.

As illustrated in FIG. 4, wiring layers are stacked on the semiconductor substrate 10 with insulating layers 14 interposed therebetween, the wiring layers corresponding to the select gate lines SGSB0, SGSY0, and SGSX0, the word lines WL0 to WL7, the dummy word lines WLD0 and WLD1, the word lines WL8 to WL15, and the select gate lines SGDC0, SGDB0, and SGDA0, and one end of each of the wiring layers together form a staircase of a plurality of steps, or terraces TS, extending in the first and third directions D1 and D3. Hereinafter, in the third direction D3 perpendicular to the semiconductor substrate 10, the wiring layer corresponding to the select gate line SGSB0 is referred to as the lowermost wiring layer, and the wiring layer corresponding to the select gate line SGDA0 is referred to as the uppermost wiring layer.

A contact plug CC for connection with an upper layer wiring (not illustrated) is connected to each terrace TS. The number of the contact plugs CC connected to one terrace TS may be two or more.

As illustrated in FIG. 5, in the region RB, dummy pillars HR penetrating each wiring layer and reaching the silicon substrate are provided. The dummy pillar HR is not electrically connected to the upper layer wiring or the semiconductor substrate 10. Prior to the gaps between the insulating layers 14 which form the select gate lines SGD and SGS, the word lines WL, and the dummy word lines WLD being embedded with a metal such as tungsten (W), the dummy pillar HR functions as a pillar which supports the insulating layers 14 over the gaps therebetween which are filled to form the select gate lines SGD and SGS, the word lines WL, and the dummy word lines WLD.

Returning to FIG. 3, the distance between the center portion of the contact plug CC in the radial direction, which is connected to the lowermost wiring layer corresponding to the select gate line SGSB, and the center portion of one of the dummy pillar HR closest thereto in the radial direction (hereinafter, referred to as "closest"), is W1. In addition, the distance between the center portion of the contact plug CC in the radial direction, which is connected to another wiring layer (the select gate lines SGD, the word lines WL, the dummy word lines WLD, and the select gate lines SGSX and SGSY) and the center portion of the closest dummy pillar HR in the radial direction is W2, where the distance W1 is greater than the distance W2. In other words, the gap between the center of the contact plug CC connected to the lowermost wiring layer and the central axis adjacent dummy pillar HR is wider than a corresponding gap between the contact plug CC connected to other wiring layers and the dummy pillar HR. Further, even when the center axis of the contact plug CC is inclined with respect to the third direction D3, the distance W1 is set such that the contact plug CC does not contact the dummy pillar HR.

Next, a sectional configuration of the memory pillar MP and the source line contact LI will be described in detail with reference to FIG. 6. FIG. 6 is a sectional view of the memory pillar MP taken along a second direction D2.

As illustrated in FIG. 6, the memory pillar MP and the source line contact LI are alternately formed along the second direction D2. The memory pillar MP is commonly connected to the select gate lines SGD and SGS, the word lines WL, and the dummy word lines WLD.

More specifically, an n-type well 11 is provided on a surface region of the semiconductor substrate 10, and a p-type well 12 is provided on a surface region of the n-type well 11. In addition, an n+-type diffusion layer 13 is provided in a portion of the surface region of the p-type well 12. The wiring layers are stacked on the semiconductor substrate 10 with insulating layers 14 interposed therebetween, the wiring layers including three wiring layers 15 functioning as the select gate lines SGSB0, SGSY0, and SGSX0, eight wiring layers 15 functioning as the word lines WL0 to WL7, two wiring layers 15 functioning as the dummy word lines WLD0 and WLD1, eight wiring layers 15 functioning as the word lines WL8 to WL15, and three wiring layers 15 functioning as the select gate lines SGDC0, SGDB0, and SGDA0 in order from the lower layer. In other words, sixteen insulating layers 14 and sixteen wiring layers 15 are alternately stacked on the semiconductor substrate 10. In FIGS. 4 and 5, the lowermost one of the insulating layers 14 is depicted as an insulating layer 14a, and the next lowermost one of the insulating layers 14 is depicted as an insulating layer 14b. An insulating layer 14 is formed on the uppermost wiring layer 15. As the insulating layer 14, for example, a silicon oxide film is used. As the wiring layer 15, for example, tungsten and titanium nitride as a barrier metal of tungsten are used.

A memory pillar MP that penetrates the insulating layers 14 and the wiring layers 15 and reaches the p-type well 12 is formed. Thus, the wiring layer 15 functioning as the select gate line SGSB0 is a lowermost wiring layer through which the memory pillar MP penetrates in the third direction D3. For example, the memory pillar MP includes a connecting portion JC between two wiring layers 15 corresponding to the dummy word lines WLD1 and WLD0. For example, when forming a memory hole 22 of the memory pillar MP in twice, the connecting portion JC for connecting two holes is provided. For example, the memory hole 22 may have a shape extending from the insulating layer 14 on an upper layer of the select gate line SGDA0 to the semiconductor substrate 10 without passing through a connecting portion JC, and may have a shape in which a plurality of connecting portions JC are provided and three or more memory sub-holes communicate with each other.

The memory pillar MP includes a block insulating film 17, a charge storage layer 18, a tunnel insulating film 19, and semiconductor layers 16, 20, and 21.

The semiconductor layer 16 is provided as the lower or bottom portion of the memory pillar MP. In the third direction D3, the height of an upper surface of the semiconductor layer 16 from the p type well 12 is greater than the height of the upper surface of the wiring layer 15 corresponding to the select gate line SGSB0 from the p type well 12, and is lower than the height of the bottom surface of the select gate line SGSY0 from the p type well 12. For example, the semiconductor layer 16 is configured of silicon formed by epitaxial growth.

The block insulating film 17, the charge storage layer 18, and the tunnel insulating film 19 are subsequently formed on side surfaces of the memory pillar MP. As the block insulating film 17 and the tunnel insulating film 19, for example, a silicon oxide film is used. As the charge storage layer 18, for example, a silicon nitride film is used.

Semiconductor layers 20 and 21 are formed on the inside of the memory pillar MP that is surrounded by the tunnel insulating film 19, and fill the inside of the memory pillar MP. The height of the upper surface of the semiconductor layer 20 from the p type well 12 is greater than the height of the upper surface of the select gate line SGDA from the p type well 12. The semiconductor layer 21 is formed on the semiconductor layer 20. For example, polysilicon is used for the semiconductor layer 20, and for example, phosphorus-doped polysilicon is used for the semiconductor layer 21. The semiconductor layer 20 is a region in which a channel is formed when the memory cell transistors MT, the dummy memory cell transistors MTD, and the select transistors ST1 and ST2 are turned on.

A contact plug (not illustrated) is formed on an upper surface of the memory pillar MP, and is connected to the bit line BL. The memory cell transistors MT0 to MT15 and the dummy memory cell transistors MTD0 and MTD1 are formed by the memory pillar MP, the word lines WL0 to WL15, and the dummy word lines WLD0 and WLD1. Similarly, the select transistors ST1 are formed by the memory pillar MP and the select gate lines SGD (SGDA, SGDB, and SGDC), and the select transistors ST2 are formed by the memory pillar MP and the select gate lines SGS (SGSX, SGSY, and SGSB). In the example of FIG. 6, although three layers of the select gate lines SGD and three layers of the select gate lines SGS are provided, by the common electrical connection between the select gate lines SGD and the common electrical connection between the select gate lines SGS, the select gate lines SGD and the select gate lines SGS substantially function as agate electrode of one select transistor ST1 and a gate electrode of one select transistor ST2.

The source line contact LI includes a semiconductor layer 23 and a metal layer 24. A bottom surface of the source line contact LI is connected to the n$^+$-type diffusion layer 13, and an upper surface of the source line contact LI is connected to the source line SL (not illustrated).

The semiconductor layer 23 is provided as the lower portion of the source line contact LI, and is in contact with the n$^+$-type diffusion layer 13. For the semiconductor layer 23, for example, phosphorus-doped polysilicon is used.

The metal layer 24 is provided on the semiconductor layer 23. For the metal layer 24, for example, tungsten and titanium nitride as a barrier metal of tungsten are used.

For example, in a case where a circuit such as the sense amplifier 113 is provided between the semiconductor substrate 10 and the memory cell array 111, a wiring layer functioning as the source line SL may be provided above the circuit such as a sense amplifier, the wiring layer being formed by a metal layer and an n-type semiconductor layer formed on the metal layer. In this case, the bottom portion of the memory pillar MP and a bottom portion of the source line contact LI are in contact with an upper surface of the wiring layer functioning as the source line, and the memory pillar MP and the source line contact LI are electrically connected to the wiring layer.

Next, sectional configurations of the contact plug CC and the dummy pillar HR will be described with reference to FIG. 7 and FIG. 8. FIG. 7 is a sectional view of the contact plug CC, which is connected to the wiring layer 15 corresponding to the select gate line SGSY, and the dummy pillar HR disposed closest to the contact plug CC, taken along a fourth direction D4 parallel to the semiconductor substrate and different from the first direction D1 and the second direction D2. FIG. 8 is a sectional view of the contact plug CC, which is connected to the lowermost wiring layer 15 corresponding to the select gate line SGSB, and the dummy pillar HR disposed closest to the contact plug CC, taken along a fifth direction D5 parallel to the semiconductor substrate and different from the first direction D1, the second direction D2, and the fourth direction D4.

As illustrated in FIG. 7 and FIG. 8, a bottom surface of the contact plug CC is in contact with an upper surface of the wiring layer 15, and does not penetrate the wiring layer 15. Further, an upper surface of the contact plug CC is connected to the row decoder 112 via an upper layer wiring (not illustrated). For the contact plug CC, for example, tungsten and titanium nitride as a barrier metal of tungsten are used.

Similar to the memory pillar MP, the dummy pillar HR includes the block insulating film 17, the charge storage layer 18, the tunnel insulating film 19, and the semiconductor layers 16, 20, and 21. The dummy pillar HR is formed, for example, at the same time as the memory pillar MP, and includes a connecting portion JC similarly to the memory pillar MP. A bottom surface of the dummy pillar HR is in contact with the semiconductor substrate 10. On the other hand, unlike the memory pillar MP, in the dummy pillar HR, the block insulating film 17, the charge storage layer 18, and the tunnel insulating film 19 are stacked on the semiconductor layer 16. Thereby, the semiconductor layer 16 and the semiconductor layer 20 are not electrically connected to each other. Further, an upper surface of the dummy pillar HR is not electrically connected to an upper layer wiring (not illustrated). Therefore, the dummy pillar HR is in a floating state.

As illustrated in FIG. 7, for example, the distance between the center portion of an upper end of the contact plug CC in the radial direction, the contact plug CC being connected to the wiring layer 15 second from the lower layer, and the center portion of an upper end of the dummy pillar HR closest to the contact plug CC in the radial direction is W2.

In addition, as illustrated in FIG. 8, the distance between the center portion of an upper end of the contact plug CC in the radial direction, the contact plug CC being connected to the lowermost wiring layer 15, and the center portion of an upper end of the dummy pillar HR closest to the contact plug CC in the radial direction is W1.

Each of the distances W1 and W2 may be a distance between the center portion of a lower end of the contact plug CC in the radial direction and the center portion of a lower end of the dummy pillar HR in the radial direction. Alternatively, each of the distances W1 and W2 may be a distance from an end portion of the contact plug CC to an end portion of the dummy pillar HR.

1.3 Effect According to Present Embodiment

With the configuration according to the present embodiment, it is possible to improve reliability. Hereinafter, this effect will be described in detail.

Figure 9:
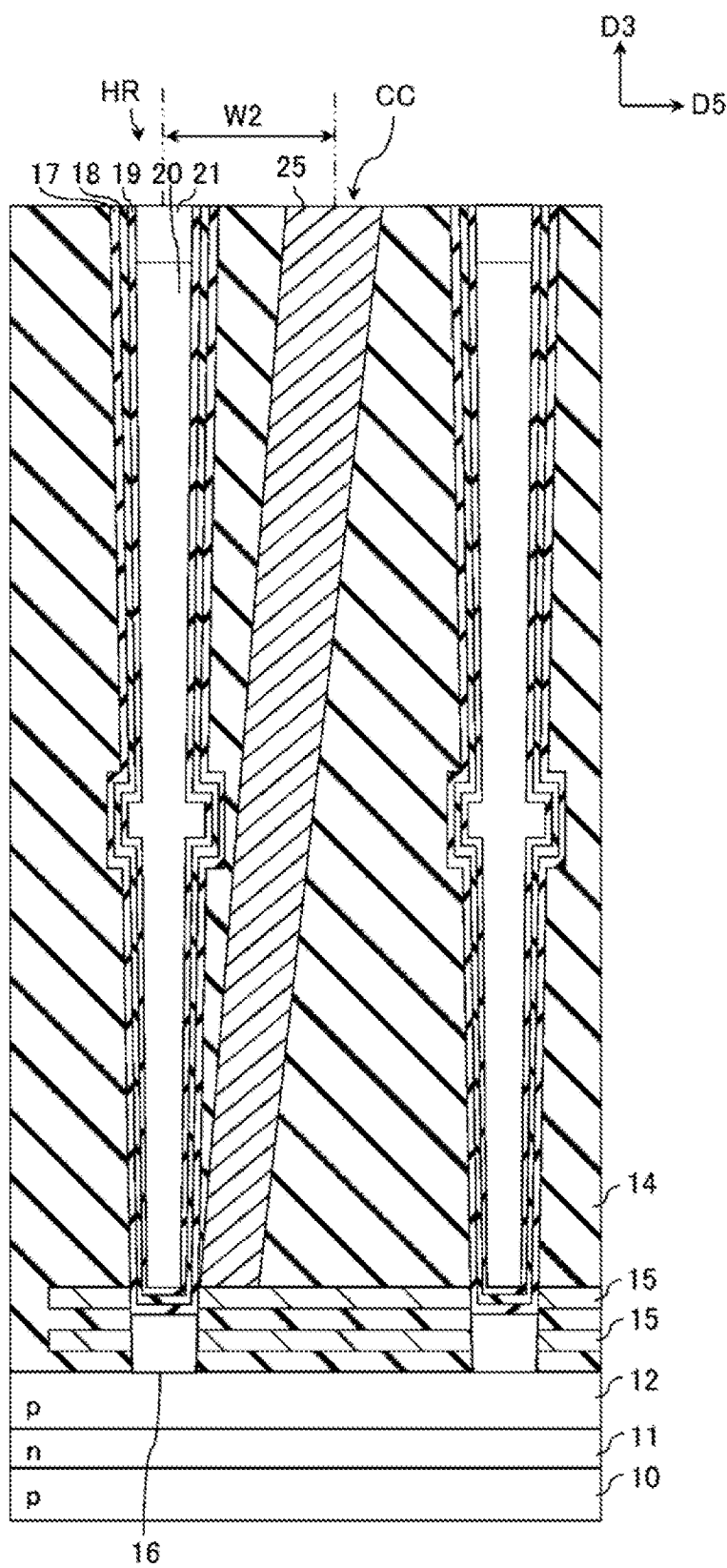
FIG. 9 is a view illustrating a state where a contact plug is inclined in the memory cell array in the semiconductor memory device according to the first embodiment.
Figure 10:
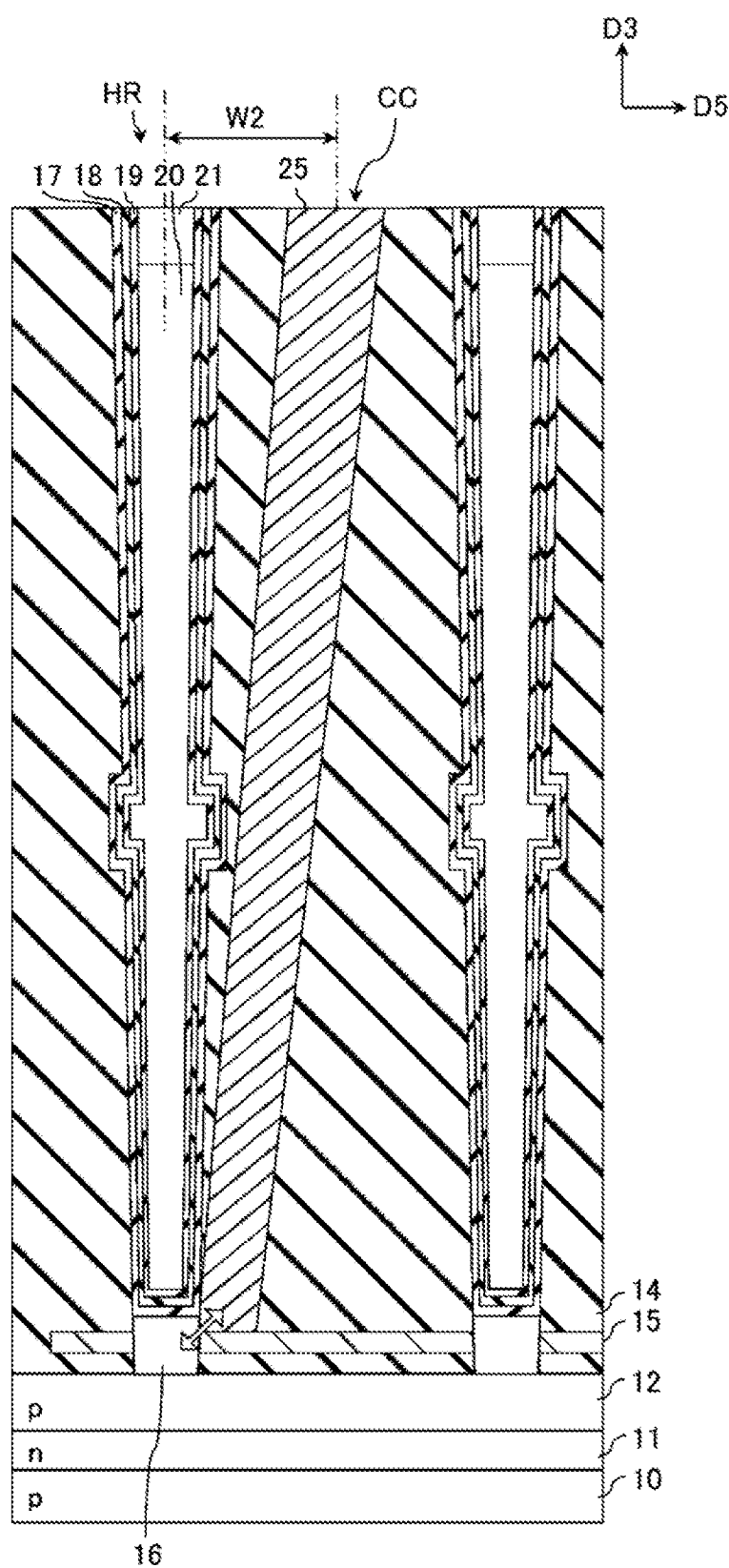
FIG. 10 is a view of a comparative example illustrating a state where a contact plug is inclined.
Figure 11:
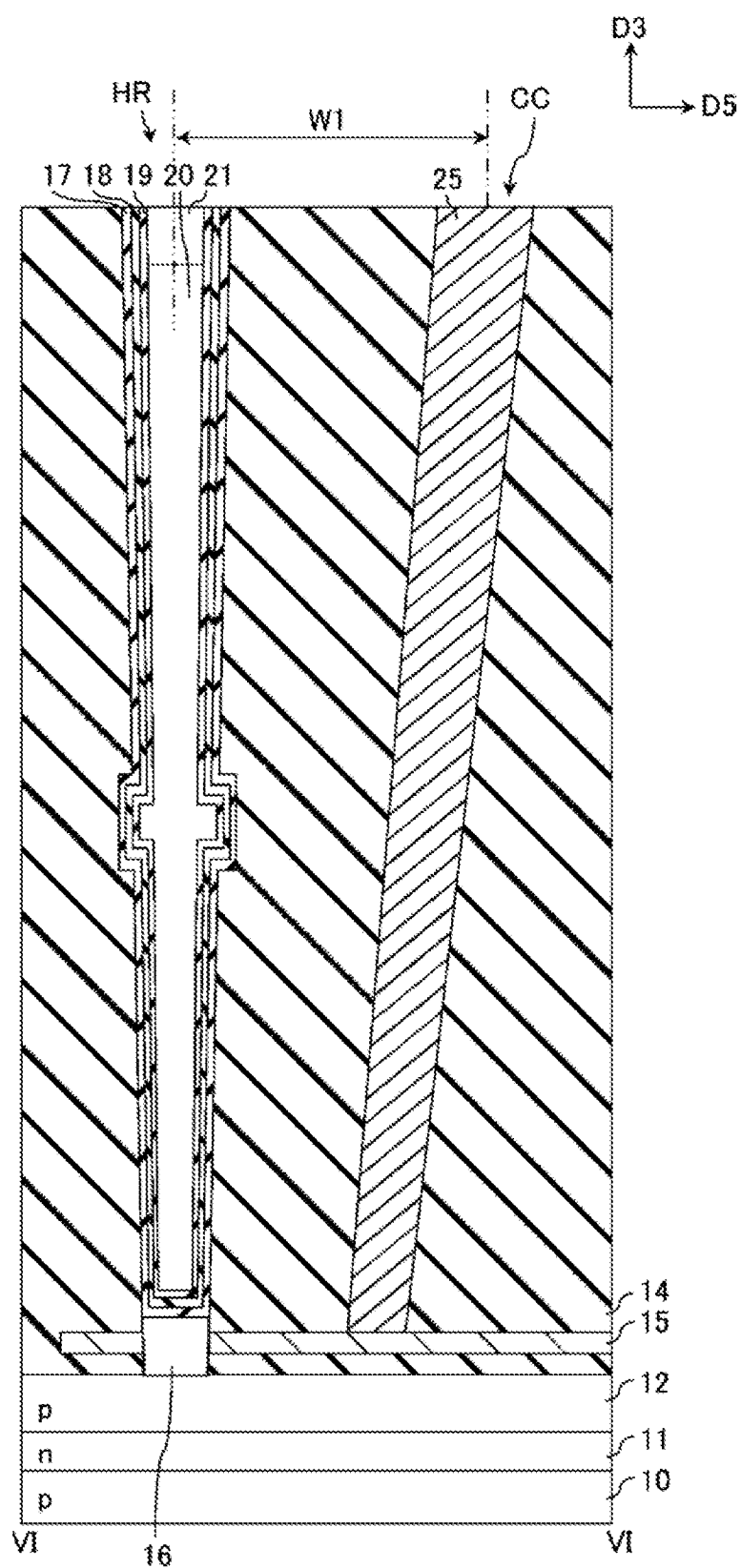
FIG. 11 is a view illustrating a state where a contact plug is inclined in the memory cell array in the semiconductor memory device according to the first embodiment.

First, when forming a contact hole of the contact plug CC, an influence in a case where the center axis of the hole is inclined with respect to the third direction D3 will be described with reference to FIG. 9 to FIG. 11. FIG. 9 is a view illustrating an example in which the contact plug CC connected to the wiring layer 15 second from the lower layer is inclined in the configuration according to the present embodiment. FIG. 10 is a view illustrating a comparative example in which a distance between the center portion of the contact plug CC in the radial direction and the center portion of the closest dummy pillar HR in the radial direction is W2 and the contact plug CC is inclined, the contact plug CC being connected to the lowermost wiring layer 15. FIG. 11 is a view illustrating an example in which the contact plug CC connected to the lowermost wiring layer 15 is inclined in the configuration according to the present embodiment.

As illustrated in FIG. 9, for example, in some cases, the contact plug CC, which is connected to the wiring layer 15 second from the lowermost layer wiring layer 15, may be inclined and may contact the closest dummy pillar HR. Since the block insulating film 17, the charge storage layer 18, and the tunnel insulating film 19 are formed on the side surfaces of the dummy pillar HR and on the semiconductor layer 16 and will remain in place even if the hole being etched for the contact reaches them, the contact plug CC is not electrically connected to the semiconductor substrate 10 via the semiconductor layer 16. Therefore, the distance W2 between the center portion of the contact plug CC in the radial direction and the center portion of the closest dummy pillar HR in the radial direction can be relatively short. The same is also true in a case where the contact plug CC connected to the wiring layer 15 third and subsequent from the lower layer is inclined.

As illustrated in FIG. 10 however, at the lowermost wiring layer 15, in a case where a distance between the center portion of the contact plug CC in the radial direction and the center portion of the closest dummy pillar HR in the radial direction is a distance W2, similar to the case illustrated in FIG. 9, the bottom portion of the contact plug CC may contact the dummy pillar HR in some cases, because there is no protective layer, i.e., the block insulating film 17, the charge storage layer 18, and the tunnel insulating film 19, around the semiconductor layer 16 at the base of the dummy pillar HR to prevent the contact hole from reaching the semiconductor layer. Since the height of an upper surface of the semiconductor layer 16 from the substrate 10 is higher than the height of an upper surface of the lowermost wiring layer 15 from the substrate 10, when the bottom portion of the contact plug CC contacts the dummy pillar HR, the contact plug CC may be electrically connected to the semiconductor layer 16 on the bottom portion of the dummy pillar HR, and thus be electrically connected to the semiconductor substrate 10 via the semiconductor layer 16.

In contrast, with the configuration according to the present embodiment, the distance between the center portion of the contact plug CC in the radial direction, the contact plug CC being connected to the lowermost wiring layer 15, and the center portion of the closest dummy pillar HR in the radial direction is set to a distance W1 at which the contact plug CC does not contact with the dummy pillar HR even when the contact plug CC is inclined, the distance W1 longer than the distance W2. Thereby, as illustrated in FIG. 11, even when the contact plug CC is inclined, it is possible to prevent the contact plug CC from being electrically connected to the semiconductor substrate 10 via the dummy pillar HR. Therefore, it is possible to prevent short circuit between the row decoder 112 and the select gate lines SGS and the semiconductor substrate, and thus it is possible to improve reliability of the semiconductor memory device.

2. Second Embodiment

Next, a second embodiment will be described. In the second embodiment, a staircase shape different from that in the first embodiment will be described. Hereinafter, only differences from the first embodiment will be described.

2.1 Configuration of Memory Cell Array

A configuration of the memory cell array 111 will be described with reference to FIG. 12.

Figure 12:
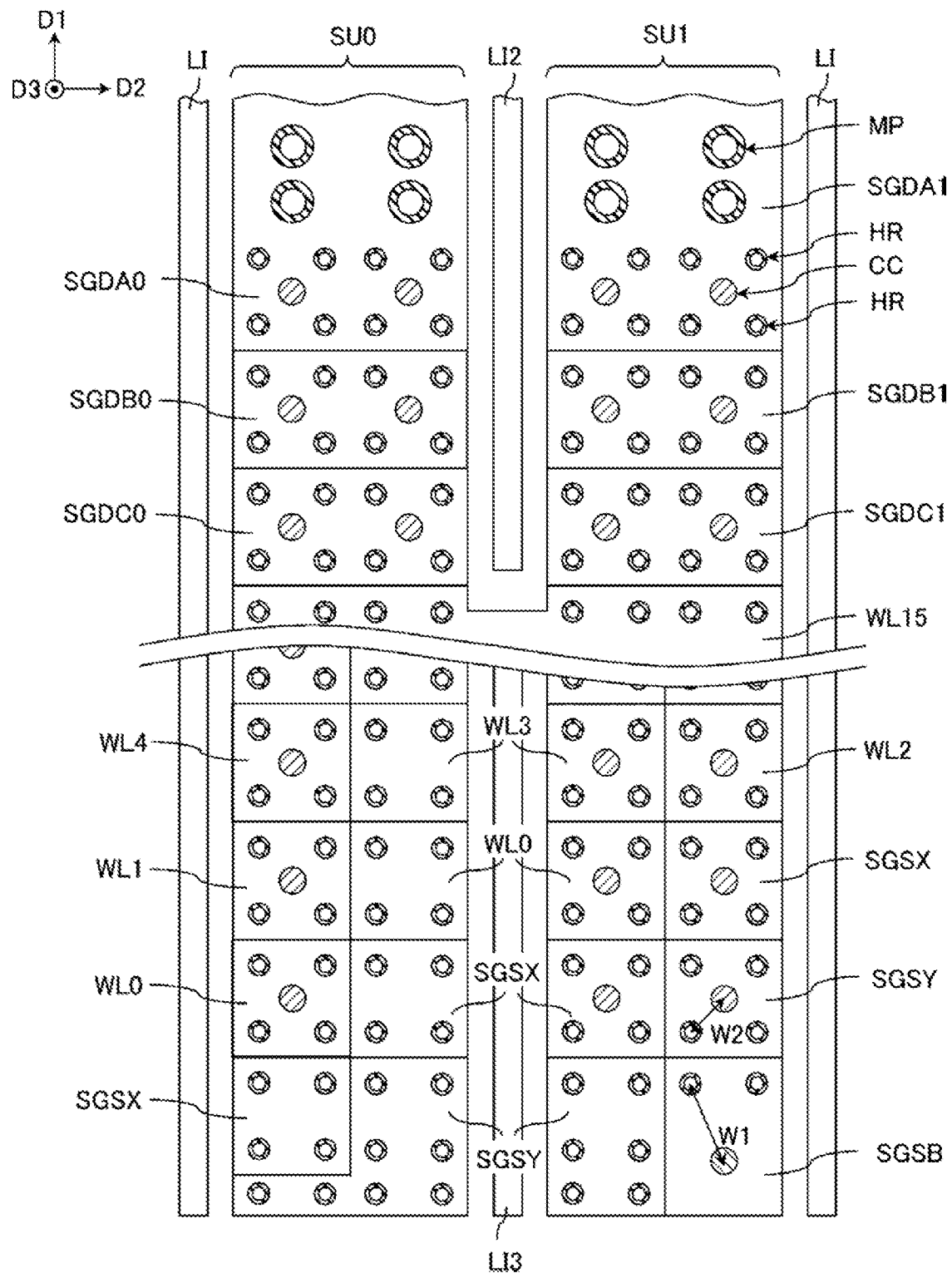
FIG. 12 is a plan view of a memory cell array in a semiconductor memory device according to a second embodiment.

As illustrated in FIG. 12, the string units SU0 and SU1 share the word lines WL, the dummy word lines WLD, and the select gate lines SGS. The select gate lines SGD0 (SGDA0, SGDB0, and SGDC0) in the string unit SU0 and the select gate lines SGD1 (SGDA1, SGDB1, and SGDC1) in the string unit SU1 are separated from each other by a source line contact LI2 provided between the string units SU0 and SU1 and extending in the first direction D1. Here, the source line contact LI2 has a length in the first direction D1 so as not to separate the word line WL15 disposed below the select gate line SGDC in the second direction D2. Thereby, the word lines WL, the dummy word lines WLD, and the select gate lines SGS of the string units SU0 and SU1 are connected in common.

Portions of the word lines WL, the dummy word lines WLD, and the select gate lines SGS of the string units SU0 and SU1 are separated by a source line contact LI3 provided between the string units SU0 and SU1 and extending in the first direction D1. Configurations of the source line contacts LI2 and LI3 are the same as that of the source line contact LI. The terraces TS of each of the word lines WL, the dummy word lines WLD, and the select gate lines SGS are arranged in three rows in parallel and in a staircase shape, and the terraces TS in the center row are separated by the source line contact LI3 along the second direction D2. In the following description, it is assumed that rows of the terraces TS extending in the first direction D1 include a first row, a second row, and a third row in that order from the string unit SU1 to the string unit SU0 in the second direction D2. In addition, stages of the terraces TS are referred to as a first stage, a second stage, a third stage, a fourth stage . . . in that order, from a position distal of the memory pillars MP in the first direction D1.

In the example of FIG. 12, the terrace corresponding to the select gate line SGSB is provided in the first stage and the first row, and the contact plug CC is connected to the terrace. In addition, the terrace corresponding to the select gate line SGSY is provided in the first stage and the second row, and the terrace corresponding to the select gate line SGSX is provided in the first stage and the third row. The terrace corresponding to the select gate line SGSY is also provided in the second stage and the first row, and the contact plug CC is connected to the terrace in the second stage and the first row. The terraces corresponding to the select gate line SGSX are also provided in the second stage and the second row and in the third stage and the first row, and the contact plug CC is connected to each of the terraces in the second stage and the second row and in the third stage and the first row. The terraces corresponding to the word line WL0 are provided in the second stage and the third row and in the third stage and the second row, and the contact plug CC is connected to each of the terraces. Each of the terraces corresponding to the word lines WL1 to WL4 is provided individually, and a different contact plug CC is connected to each of the terraces. More specifically, the terrace corresponding to the word line WL1 is provided in the third stage and the third row. The terraces corresponding to the word lines WL2 to WL4 are provided in the fourth stage and the first to third rows.

Even in this configuration, the distance between the center portion of the contact plug CC, the contact plug CC being connected to the terrace corresponding to the select gate line SGSB, and the center portion of the closest dummy pillar HR is set to W1. In addition, the distance between the center portion of the contact plug CC, the contact plug CC being connected to the terrace corresponding to the select gate line SGSY, and the center portion of the closest dummy pillar HR is set to W2. Therefore, the distance W1 and the distance W2 have a relationship of W1>W2.

The number of the terraces TS and the contact plugs CC corresponding to one wiring layer 15 is randomly set.

2.2 Effect According to Present Embodiment

With the configuration according to the present embodiment, effects similar to those according to the first embodiment can be obtained.

3. Modification Example

According to the above-described embodiment, a semiconductor memory device includes: a first wiring layer (SGSB) provided above a semiconductor substrate (10) via a first insulating layer (14); a second wiring layer (SGSY) provided on the first wiring layer via a second insulating layer (14); a memory pillar (MP) that penetrates the first and second wiring layers, includes a first semiconductor layer (16) provided on a bottom portion thereof, a third insulating layer (17), a charge storage layer (18), and a fourth insulating layer (19) stacked on a side surface thereof, and a second semiconductor layer (20) in an inside thereof; a first plug (CC of SGSB) that is provided on the first wiring layer and is electrically connected to the first wiring layer; a second plug (CC of SGSY) that is provided on the second wiring layer and is electrically connected to the second wiring layer; a first pillar (HR of SGSB) that is disposed closest to the first plug and penetrates the first wiring layer; and a second pillar (HR of SGSY) that is disposed closest to the second plug and penetrates the first and second wiring layers. The first wiring layer is a lowermost wiring layer penetrated by the memory pillar in a first direction perpendicular to the semiconductor substrate. A distance (W1) between the center portion of the first plug and the center portion of the first pillar is longer than a distance (W2) between the center portion of the second plug and the center portion of the second pillar.

The embodiments are not limited to the above-described configurations, and various modifications may be made.

For example, in the above-described embodiments, the four string units SU of one block BLK may share the word lines WL, the dummy word lines WLD, and the select gate lines SGS.

Further, the term "connection" in the embodiments also includes a state in which components are indirectly connected to each other with another component such as a transistor, a resistor, or the like interposed therebetween.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a semiconductor substrate;
   a first wiring layer above the semiconductor substrate, the first wiring layer being a lowermost wiring layer above the semiconductor substrate;
   a second wiring layer above the first wiring layer;
   a memory pillar extending in a first direction intersecting the semiconductor substrate and through the first and second wiring layers, the memory pillar comprising a first semiconductor layer, a second semiconductor layer located above the first semiconductor layer, and a charge storage layer disposed between the second semiconductor layer and the second wiring layer;
a first plug contacting and electrically connected to the first wiring layer;
a second plug contacting and electrically connected to the second wiring layer;
a first pillar located next to the first plug, and closest to the first plug, and extending through the first wiring layer and not extending through the second wiring layer; and
a second pillar located next to the second plug, and closest to the second plug, and extending through the first and second wiring layers,
wherein a first point is a center of the first plug in a first cross-section viewed from the first direction at a level of an upper surface of the first wiring layer, a second point is a center of the first pillar in the first cross-section, a third point is a center of the second plug in a second cross-section viewed from the first direction at a level of an upper surface of the second wiring layer, and a fourth point is a center of the second pillar in the second cross-section, and
a distance from the first point to the second point is greater than a distance from the third point to the fourth point.

2. The semiconductor memory device according to claim 1
wherein a first insulating layer is located on the semiconductor substrate,
the memory pillar is electrically connected to the semiconductor substrate, and
the first and second pillars contact the semiconductor substrate.

3. The semiconductor memory device according to claim 1,
wherein each of the first and second pillars includes a third semiconductor layer, a fourth semiconductor layer located over the third semiconductor layer, and a second insulating layer, a charge storage layer, and a third insulating layer located on a side surface of the fourth semiconductor layer.

4. The semiconductor memory device according to claim 1,
wherein the first and second pillars are in an electrically floating state.

5. The semiconductor memory device according to claim 1,
wherein the first wiring layer includes a first terrace at which the first plug is connected to the first wiring layer;
the second wiring layer includes a second terrace at which the second plug is connected to the second wiring layer; and
the second terrace terminates inwardly of the first terrace in a second direction parallel to the semiconductor substrate.

6. The semiconductor memory device according to claim 1, further comprising:
a bit line connected to the memory pillar;
a sense amplifier connected to the memory pillar through the bit line; and
a row decoder connected to the first and second plugs.

7. The semiconductor memory device according to claim 1,
wherein a distance between an upper surface of the first semiconductor layer and the semiconductor substrate is greater than a distance between the upper surface of the first wiring layer and the semiconductor substrate, and less than of tho a distance between a bottom surface of the second wiring layer and the semiconductor substrate.

8. The semiconductor memory device according to claim 1, further comprising a plurality of word lines spaced from one another in the first direction and extending in a second direction crossing the first direction; and
adjacent ones of the word lines in the first direction are connected to contacts adjacent to one another in the second direction.

9. The semiconductor memory device according to claim 1, further comprising a plurality of word lines spaced from one another in the first direction and extending in a second direction crossing the first direction; and
adjacent ones of the word lines in the first direction are connected to contacts adjacent to one another in one of the second direction and a third direction crossing the first and the second directions.

10. The semiconductor memory device according to claim 9, further comprising a source line extending between adjacent ones of the word lines in the third direction.

11. A semiconductor memory device comprising:
a semiconductor substrate;
a first wiring layer above the semiconductor substrate, the first wiring layer being a lowermost wiring layer above the semiconductor substrate;
a second wiring layer above the first wiring layer;
a memory pillar extending in a first direction intersecting the semiconductor substrate and through the first and second wiring layers, the memory pillar comprising a first semiconductor layer, a second semiconductor layer located above the first semiconductor layer, and a charge storage layer disposed between the second semiconductor layer and the second wiring layer;
a first plug contacting and electrically connected to the first wiring layer;
a second plug contacting and electrically connected to the second wiring layer;
a first pillar located next to the first plug, and closest to the first plug, and extending through the first wiring layer and not extending through the second wiring layer; and
a second pillar located next to the second plug, and closest to the second plug, and extending through the first and second wiring layers, the second pillar spaced from the first pillar in a second direction crossing the first direction,
wherein the first wiring layer extends, in the second direction, outwardly of the second wiring layer,
a first point is a center of the first plug in a first cross-section viewed from the first direction at a level of an upper surface of the first wiring layer, a second point is a center of the first pillar in the first cross-section, a third point is a center of the second plug in a second cross-section viewed from the first direction at a level of an upper surface of the second wiring layer, and a fourth point is a center of the second pillar in the second cross-section, and
a distance between the first point and the second point is greater than a distance from the third point to the fourth point.

12. The semiconductor memory device according to claim 11,
wherein a first insulating layer is located on the semiconductor substrate,
the memory pillar is electrically connected to the semiconductor substrate, and
the first and second pillars contact the semiconductor substrate.

13. The semiconductor memory device according to claim 11,
wherein each of the first and second pillars includes a third semiconductor layer, a fourth semiconductor layer located over the third semiconductor layer, and a second insulating layer, a charge storage layer, and a third insulating layer located on a side surface of the fourth semiconductor layer.

14. The semiconductor memory device according to claim 11,
wherein the first and second pillars are in an electrically floating state.

15. The semiconductor memory device according to claim 11,
wherein the first wiring layer includes a first terrace at which the first plug is connected to the first wiring layer;
the second wiring layer includes a second terrace at which the second plug is connected to the second wiring layer; and
the second terrace terminates inwardly of the first terrace in the second direction, which is parallel to the semiconductor substrate.

16. The semiconductor memory device according to claim 11, further comprising:
a bit line connected to the memory pillar;
a sense amplifier connected to the memory pillar through the bit line; and
a row decoder connected to the first and second plugs.

17. The semiconductor memory device according to claim 11,
wherein a distance between an upper surface of the first semiconductor layer and the semiconductor substrate is greater than a distance between the upper surface of the first wiring layer and the semiconductor substrate, and less than a distance between a bottom surface of the second wiring layer and the semiconductor substrate.

18. The semiconductor memory device according to claim 11, further comprising a plurality of word lines spaced from one another in the first direction and extending in the second direction; and
adjacent ones of the word lines in the first direction are connected to contacts adjacent to one another in the second direction.

19. The semiconductor memory device according to claim 11, further comprising a plurality of word lines spaced from one another in the first direction and extending in the second direction; and
adjacent ones of the word lines in the first direction are connected to contacts adjacent to one another in one of the second direction and a third direction crossing the first and the second directions.

20. The semiconductor memory device according to claim 19, further comprising a source line extending between adjacent ones of the word lines in the third direction.

* * * * *